US005968190A

United States Patent [19]
Knaack

[11] Patent Number: 5,968,190

[45] Date of Patent: Oct. 19, 1999

[54] REDUNDANCY METHOD AND CIRCUIT FOR SELF-REPAIRING MEMORY ARRAYS

[75] Inventor: Roland T. Knaack, Starkville, Miss.

[73] Assignee: Cypress Semiconductor Corp., San Jose, Calif.

[21] Appl. No.: 08/741,953

[22] Filed: Oct. 31, 1996

[51] Int. Cl.[6] .......... G01R 31/28

[52] U.S. Cl. .......... 714/719; 365/201

[58] Field of Search .......... 371/21.2, 10.2, 371/10.3, 20.4, 25.1, 40.11; 395/183.01, 183.06, 183.18; 365/201, 200, 230.03, 189.12; 714/6, 7, 30, 720, 733, 734, 742, 743

[56] References Cited

U.S. PATENT DOCUMENTS

| | | | |
|---|---|---|---|
| 4,615,030 | 9/1986 | Kumagai | 371/71 |
| 4,802,122 | 1/1989 | Auvinen et al. | 365/154 |
| 4,839,866 | 6/1989 | Ward et al. | 365/221 |
| 4,875,196 | 10/1989 | Spaderna et al. | 365/238 |
| 4,891,788 | 1/1990 | Kreifels | 365/49 |
| 5,084,837 | 1/1992 | Matsumoto et al. | 395/250 |
| 5,088,061 | 2/1992 | Golnabi et al. | 365/189.01 |
| 5,228,002 | 7/1993 | Huang | 365/221 |
| 5,241,501 | 8/1993 | Tanaka | 365/201 |
| 5,262,996 | 11/1993 | Shiue | 362/221 |
| 5,278,793 | 1/1994 | Yeh | 365/200 |
| 5,305,253 | 4/1994 | Ward | 365/73 |
| 5,311,475 | 5/1994 | Huang | 365/221 |
| 5,317,756 | 5/1994 | Komatsu et al. | 395/800 |
| 5,367,486 | 11/1994 | Mori et al. | 365/189.05 |
| 5,404,332 | 4/1995 | Sato et al. | 365/201 |
| 5,406,273 | 4/1995 | Nishida et al. | 340/825.51 |
| 5,406,554 | 4/1995 | Parry | 370/58.1 |
| 5,416,740 | 5/1995 | Fujita et al. | 365/200 |
| 5,426,612 | 6/1995 | Ichige et al. | 365/220 |
| 5,459,733 | 10/1995 | Alapat | 371/21.1 |
| 5,467,319 | 11/1995 | Nusinov et al. | 365/231 |
| 5,479,370 | 12/1995 | Furuyama et al. | 365/189.12 |
| 5,487,041 | 1/1996 | Wada | 365/200 |
| 5,490,257 | 2/1996 | Hoberman et al. | 395/427 |
| 5,506,809 | 4/1996 | Csoppenszky | 365/221 |
| 5,513,318 | 4/1996 | van de Goor et al. | 395/185.01 |
| 5,521,876 | 5/1996 | Hattori et al. | 365/221 |
| 5,546,347 | 8/1996 | Ko et al. | 365/221 |
| 5,619,461 | 4/1997 | Roohparvar | 365/201 |
| 5,642,318 | 6/1997 | Knaack et al. | 365/201 |
| 5,652,725 | 7/1997 | Suma et al. | 365/200 |

FOREIGN PATENT DOCUMENTS

| | | |
|---|---|---|
| 0113996 | 8/1989 | Japan . |
| 0676559 | 6/1994 | Japan . |

*Primary Examiner*—Robert W. Beausoliel, Jr.
*Assistant Examiner*—Nadeem Iqbac
*Attorney, Agent, or Firm*—Christopher P. Maiorana, P.C.

[57] ABSTRACT

The present invention concerns a circuit and method to automatically test and disable defective rows in a FIFO or other buffer where the wordlines or rows of the FIFO buffer are driven by a shift register scheme. Additional enabled rows may be placed within the normal memory array. The additional enabled rows are substituted, as needed, for one or more defective rows. As a result, a defective row can be automatically disabled without effecting the operation of the FIFO, particularly the read or write data path. In one example, the disabling effect is achieved by using a comparison circuit to determine if the words read from the memory are accurate. The present invention can be used to effectively bypass any single shift register element or a multiple number of shift register elements.

20 Claims, 3 Drawing Sheets

REDUNDANCY METHOD AND CIRCUIT FOR SELF-REPAIRING MEMORY ARRAYS

FIELD OF THE INVENTION

The present invention relates to memory arrays generally and more particularly, to a circuit and method for automatically disabling defective wordlines in a FIFO or other memory array having wordlines driven by a shift register.

BACKGROUND OF THE INVENTION

Memory arrays can use redundant memory cells and wordlines to compensate for production errors. Specifically, after the production of a complete memory array, a post production test of the memory array is generally performed. If the post-production testing indicates that a particular cell of the memory array is defective, a redundant memory cell and wordline can be substituted. This substitution typically occurs after the entire memory array has been manufactured. By allowing an invalid memory cell to be replaced by a redundant cell after production, the memory array can still be used.

A first-in first-out (FIFO) buffer receives data at an input and presents data to an output. The data presented to the output is presented in an order that is consistent with the order that the data was received at the input. As a result, a typical FIFO buffer does not require external address signals for operation. This lack of external address signals makes it difficult to provide redundant memory cells.

SUMMARY OF THE INVENTION

The present invention concerns a circuit and method to automatically test and disable defective rows in a FIFO or other buffer where the wordlines or rows of the FIFO buffer are driven by a shift register scheme. Additional enabled rows may be placed within the normal memory array. The additional enabled rows are substituted, as needed, for one or more defective rows. As a result, a defective row can be automatically disabled without effecting the operation of the FIFO, particularly the read or write data path. In one example, the disabling effect is achieved by using a comparison circuit to determine if the words read from the memory are accurate. The present invention can be used to effectively bypass any single shift register element or a multiple number of shift register elements.

The initial execution of the present invention may require an external testing device to provide the self test, compare and program functions. However, the present invention would eliminate the need for a laser repair flow even if external circuitry were implemented. The self test, compare and program functions in an external device such as a tester, would detect defective wordlines and/or memory elements and enable circuitry to disable the appropriate shift register (s).

The objects, features and advantages of the present invention include providing a circuit and method that automatically enables a redundancy scheme in memory designs where wordlines are driven by shift registers. The present invention may be used with groups of shift register elements of any size greater than one or can be applied to individual shift register elements of the design. Each shift register group or element that is connected to a wordline with defective memory cells can be individually disabled as determined by a comparison circuit. The means for disabling the particular shift register group that is connected to a wordline with defective memory cells may be accomplished without any external testing devices or without the addition of some external devices. The present invention provides a self-repairable die while introducing no ill effects on data sheet or other operating parameters.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
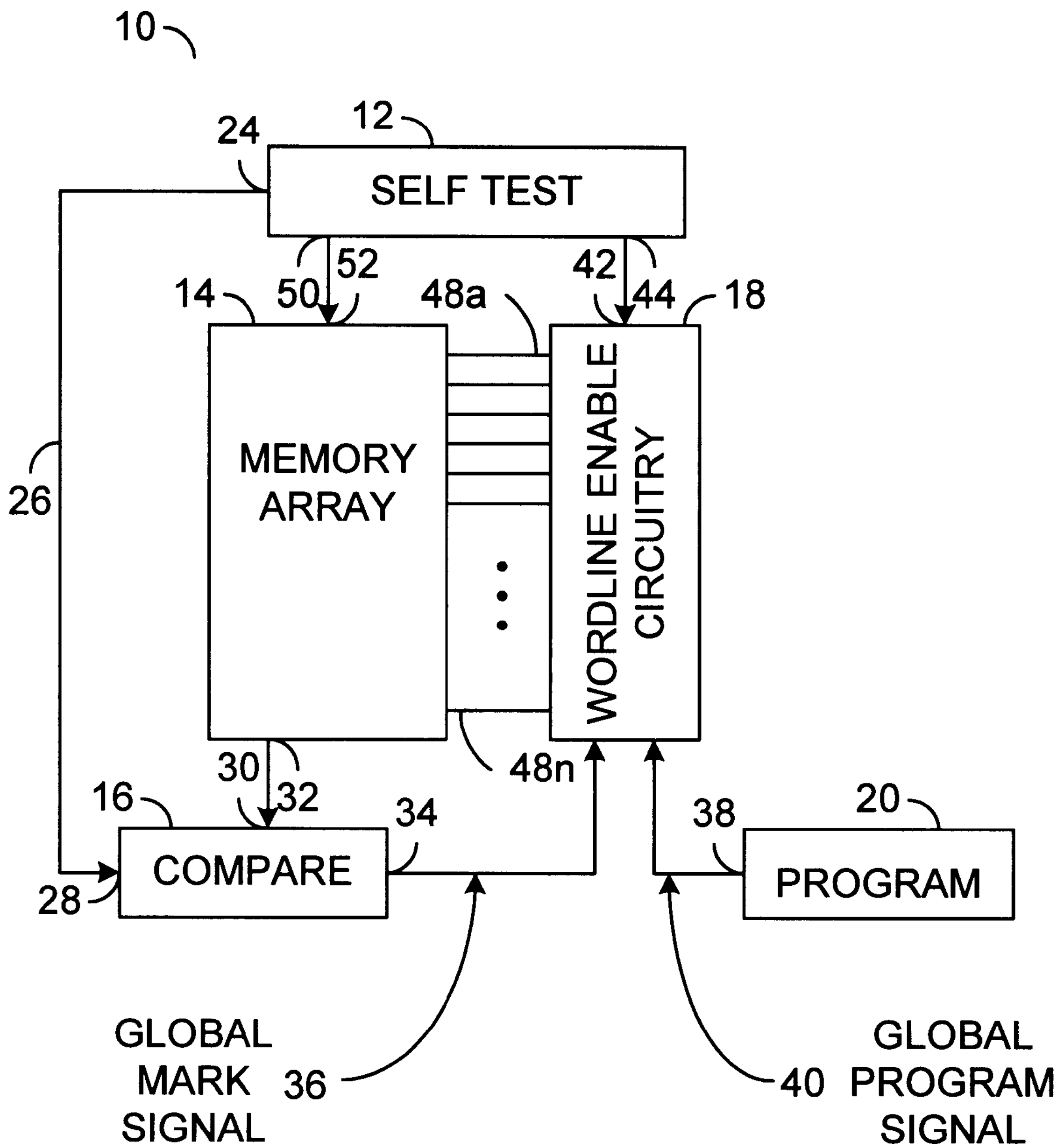
FIG. 1 is a block diagram illustrating the overall architecture of a memory array.

Referring to FIG. 1, a block diagram of a circuit 10 is shown in accordance with a preferred embodiment of the present invention. The circuit 10 generally comprises a self test block 12, a memory array 14, a compare block 16, a wordline enable block 18 and a program block 20. The self test block 12 has an output 24 that presents a signal on a data line 26 that may be received at an input 28 of the compare block 16. The compare block 16 has an input 30 that may receive a signal from an output 32 of the memory array 14. The compare block 16 has an output 34 that presents a global mark signal 36 to the wordline enable block 18. The program block 20 has an output 38 that presents a global program signal 40 to the wordline enable block 18. The wordline enable block 18 has an input 42 that may receive a signal from an output 44 of the self test block 12. The wordline enable block 18 may present a number of signals **48*a*~48*n* to the memory array 14. The self test block also has an output 50 that may present a signal to an input 52 of the memory array 14**.

The self test block 12 may be implemented on the circuit 10 directly or by an external device. The self test block 12, in its simplest form, should provide the function of being able to write a "0" to each of the memory cells of the memory array 14 and then write a "1" to each of the memory cells of the memory array 14. The self test block 12 should then be able to write an alternating bit pattern such as "010101010" to the memory array 14. Next, the self test block 12 should be able to write a second alternating bit pattern such as "101010101" to the memory array 14. Theoretically there are an unlimited number of bit pattern combinations that the self test block 12 may write to the memory array 14. However, a specific limited set of tests may be developed to determine a very high percentage of the number of defective memory cells in the memory array 14. The self test block 12 should provide the function of exercising each of the memory cells in the memory array 14 with a set of bit patterns, that are generally known in the industry, to determine which of the particular memory cells of the memory array 14 are defective. The output of the self test block 12 is presented to both the memory array 14 and the compare block 16.

The compare block 16 may be implemented either as part of the circuit 10 or as an external circuit. The compare block 16 compares the signal received at the input 28 with the signal received at the input 30. If none of the memory cells on the currently activated wordline of the memory array 14 are defective, the signal received at the input 28 and the input 30 will generally be the same. A global mark signal 36 is generally asserted when there is a comparison error between the signal received at the input 28 and the signal received at the input 30. The global mark signal 36 is used by the wordline enable block 18 to mark a condition for later disabling a currently activated wordline of the memory array 14.

The program block 20 is activated after all of the tests performed by the self test block 12 have been completed. The cycle of testing all the memory cells within the memory array 14 with a specific set of bit patterns allows the wordline enable block 18 to store a particular condition for each wordline (or set of wordlines) stored in a defective wordline latch 80 (described in connection with FIG. 2). The condition indicating whether or not a specific wordline within the memory array 14 contains a defective memory element is generally provided by the global mark signal 36 and the currently activated wordline. If a defective memory element is found, a defective condition is set for one or more of the defective memory cells for each particular wordline that contains the defective memory element. The defective condition is generally stored for each wordline (or set of wordlines) in the defective wordline latch 80 when the compare block 16 asserts the global mark signal 36. The program block 20 may assert whatever signals are necessary to program the wordline enable block 18. The program block 20, in the case of an EPROM type technology, asserts a global program signal 40 which programs a programmable element and logic connected to the particular wordline(s) where the defective condition has previously been determined. After the programming cycle is completed, the wordline enable block 18 will essentially disable, or bypass, the associated wordline or set of wordlines. In a shift register decoding scheme, by disabling a wordline or a set of wordlines, no adverse performance effects are created. The wordline enable circuitry 18 controls the memory array 14 to sequentially proceed to use the next available wordline or set of wordlines.

The output 50 the self test block 12 is generally a multi-bit bus which is generally equal to the width of the data word that would normally be written to the memory array 14 in the absence of the self test block 12 and the compare block 16. The output 44 of the self test block 12 may be implemented as a single-bit data line that controls the shift register logic for decoding the particular wordlines 48*a*–48*n*. However, in some cases, it may be possible that a multi-bit signal may be desirable to control various functions in the wordline enable block 18. The output 32 of the memory array 14 may be implemented as a multi-bit bus which is equal to the width of the data word that would have normally been read from the memory array 14.

Figure 2:
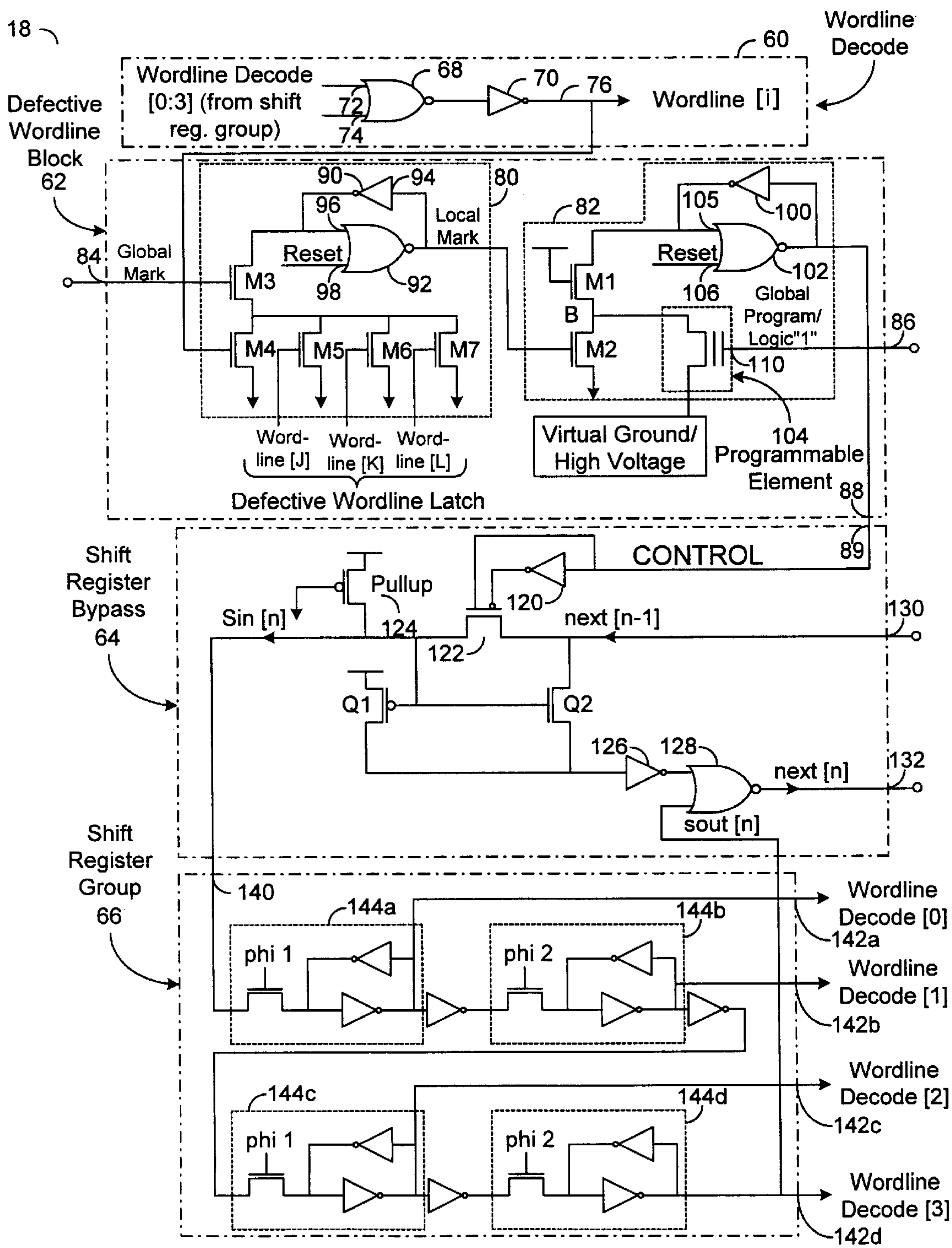
FIG. 2 is a block diagram showing the wordline enable circuitry in more detail.

Referring to FIG. 2, a more detailed block diagram of the wordline enable block 18 is shown. The wordline enable block 18 generally comprises a wordline decode block 60, a defective wordline block 62, a shift register bypass block 64 and a shift register group block 66. The wordline decode block 60 generally comprises a NAND gate 68 and an inverter 70 for each of the wordline outputs generated. The NAND gate 68 has a first input 72 that may receive a signal from the shift register group 66 and a second input 74 that may receive an input from external logic (not shown, e.g., a global enable signal for the wordline decoders). The wordline decode block 60 generally has an output 76 that represents a signal wordline[i].

The defective wordline block 62 generally comprises a defective wordline latch 80 and a programmable block 82. The defective wordline block 62 generally receives an input 84 which represents the global mark signal 36 of FIG. 1. The defective wordline block 62 also has an input 86 that generally receives the global program signal 40 also shown in FIG. 1. The defective wordline block 62 presents a signal at an output 88 that is received at an input 89 of the shift register bypass block 64. The defective wordline block also has inputs for the wordlines connected to transistors M4, M5, M6 and M7. The signal present at the output 88 generally represents a control signal for enabling or disabling a particular wordline or group of wordlines.

The defective wordline latch 80 generally comprises an inverter 90 and NOR gate 92 and a number of transistors M3, M4, M5, M6 and M7. The inverter 90 generally receives an input 94 from the output of the NOR gate 92. The NOR gate 92 generally receives a first input 96 from the inverter 90 as well as from the transistor M3. The NOR gate 92 generally receives a second input 98 that may receive a reset signal that may be an external signal provided to reset the defective wordline latch 80. The transistor M3 has a gate that generally receives the global mark signal received at the input 84. When the global mark signal is a "1" the transistor M3 turns on. When the global mark signal is a "0", the transistor M3 turns off. Any one of the four wordlines connected to the transistors M4, M5, M6 or M7 may assert the local mark signal provided the global mark signal is also on. The output of the NOR gate 92 converts the global mark signal into a local mark signal that is used to program the programmable element 104. If the local mark signal is "on", the transistor M2 is on and allows programming of the programmable element 104. The gate of the transistor M5 is generally connected to a wordline[j]. The gate of the transistor M6 is generally connected to a wordline[k]. Similarly, the gate of the transistor M7 is generally connected to a wordline[l] . The sources of the transistors M5, M6 and M7 are generally connected to a node A between the transistors M3 and M4.

The programmable block 82 generally comprises a transistor M1, a transistor M2, an inverter 100, a NOR gate 102 and a programmable element 104. The NOR gate 102 has an output that is generally connected to an input of the inverter 100 as well as to the output 88. The NOR gate 102 generally has a first input 105 that may receive a signal from the output of the inverter 100. The NOR gate 102 also has a second input 106 that generally receives the external reset signal, similar to the NOR gate 92. The source of transistor M1 is generally coupled to the input 105 of the NOR gate 102. The transistors M1 and M2 are generally cascaded together with a node B being connected to the programmable element 104. The programmable element 104 has an input 110 that generally receives the global program signal from the input 86. The programmable element 104 may be implemented as a variety of programmable devices including a Floating Avalanche Metal Oxide Semiconductor (FAMOS), an Electrically Programmable Read Only Memory (EPROM), an Electrically-Erasable Programmable Read Only Memory (EEPROM), a via link technology, a Field Programmable Gate Array (FPGA) or any other suitable programmable element.

The shift register bypass block 64 generally comprises an inverter 120, a CMOS pass gate 122, a pull-up transistor 124, a transistor Q1, a transistor Q2, an inverter 126 and a NOR gate 128. The shift register bypass block 64 operates in a fashion similar to the operation of the shift register bypass group in the copending application Ser. No. 08/691, 357, which is hereby incorporated by reference in its entirety. The inverter 120 generally receives a control signal from the input 89. An output of the inverter 120 is generally presented to an inverted input of the CMOS pass gate 122. A non-inverted input of the CMOS pass gate 122 may also receive the control signal from the input 89. The shift register bypass block 64 generally has an input 130 that may be received from a previous shift register bypass block (not shown) that may be cascaded together to control each of the wordlines 48*a*~48*a* of the memory array 14 in FIG. 1. The shift register bypass block 64 also has an output 132 that may be connected to the next shift register bypass block 64*n* (not shown).

The shift register group 66 generally comprises an input 140 and a number of outputs 142*a,* 142*b,* 142*c* and 142*d.* The outputs 142~142*d* generally represent a wordline decode signal [0~3]. The shift register group works 66 in a similar fashion to the shift register group of the above-referenced copending application. The inputs phi1 and phi2 provide clocking inputs to advance the latches 144*a*~144*d.*

Figure 3:
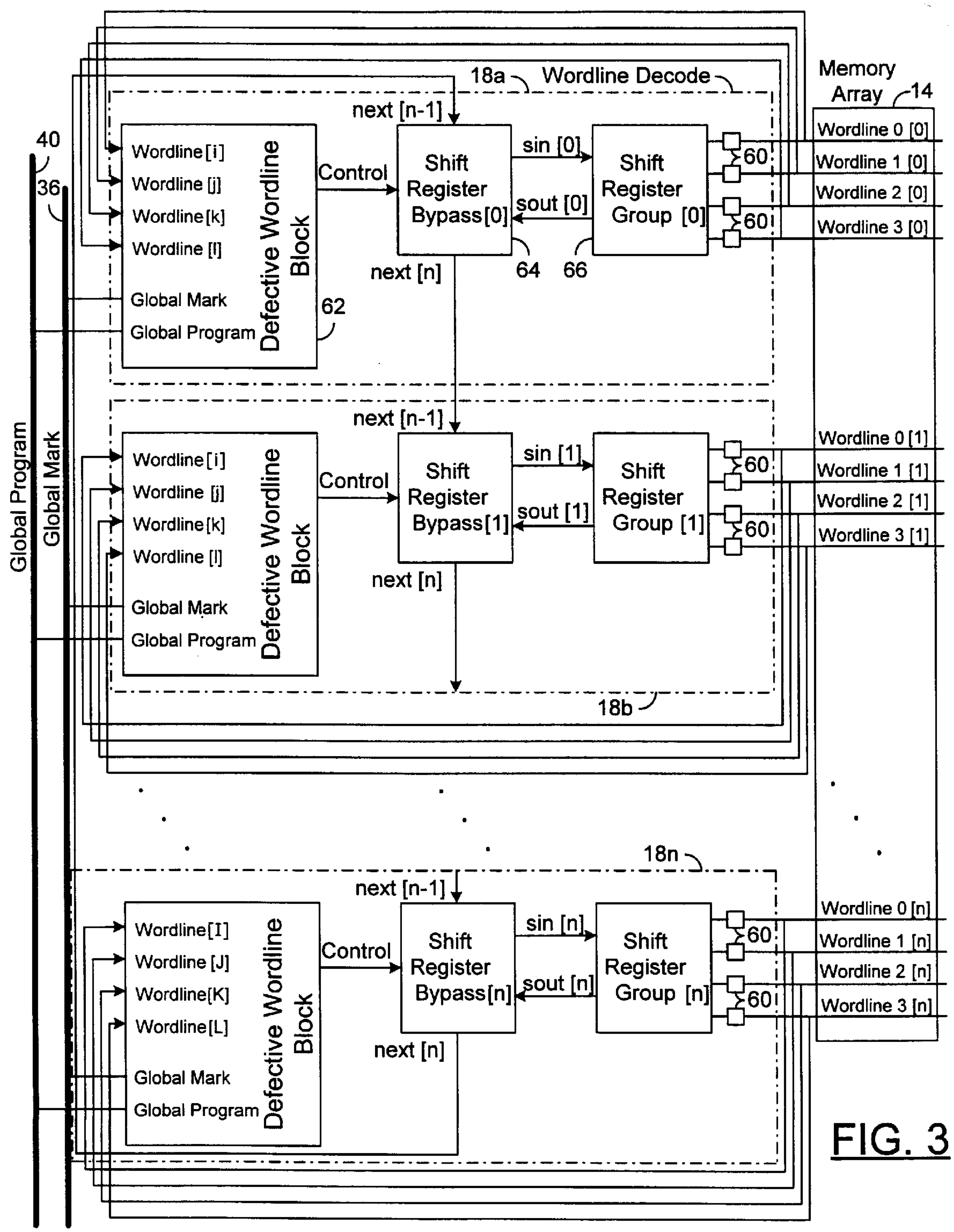
FIG. 3 is a diagram illustrating a number of wordline enable blocks configured in an overall system.

Referring to FIG. 3, a diagram illustrating a number of wordline enable blocks 18 configured in an overall system is shown. A number of wordline enable blocks 18*a,* 18*b* and 18*n* are shown. Each of the wordline enable blocks 18*a*~18*n* comprise a defective wordline block 62, a shift register bypass block 64, a shift register group block 66 and a set of wordline decode blocks 60 as described in connection with FIG. 2. Individual wordline enable blocks 18*a*~18*n* are shown such that four wordline decode blocks 60 are paired with a individual wordline enable blocks 18*a*~18*n.* The individual wordlines are shown to be generally presented to the memory array 14 such that a wordline 0[0], a wordline 1[0], a wordline 2[0] and a wordline 3[0] are generally received from the wordline enable block 18*a.* A wordline 0[1], a wordline 1[1], a wordline 2[1] and a wordline 3[1] are generally received from the wordline enable block 18*b.* A wordline 0[n], a wordline 1[n], a wordline 2[n] and a wordline 3[n] are generally received from the wordline enable block 18*n.* The global mark signal 40 is generally presented to each of the wordline enable blocks 18*a*~18*n*. Similarly, the global program signal 40 is also generally presented to each of the wordline enable blocks 18*a*~18*n.* Each of the wordline enable blocks 18*a*~18*n* is shown having four individual wordlines. The individual wordline enable blocks 18*a*~18*n* may have any number of individual wordlines presented and received. The illustration showing four wordlines per wordline enable block 18*a*~18*n* is shown as one implementation of the present invention.

The signal received at the input 140 of the shift register group 66 is shown to provide four individual wordline decode outputs 142*a*~142*d.* In such a system, the signal received at the input 140 represents a "token" that is first presented to the latch 144*a*. The latch 144*a* presents the output 142*a* that enables the wordline[0]. Next, the token is passed to the latch 144*b* which then provides a signal at the output 142*b* that enables the wordline[1]. Next, the token is presented to the latch 144*c* which presents a signal at the output 142*c* that enables wordline[2]. Finally, the token is passed to the latch 144*d* which presents a signal at the output 142*d* that enables the wordline[3].

After the token passes out of the final latch 144*d,* it is then presented to the NOR gate 128 of the shift register bypass block 64. As a result, the shift register group 66 sequentially enables the outputs 142*a,* 142*b,* 142*c* and 142*d*. In place of a shift register group 66, the signal received at the input 140 may be used to enable a single wordline. In such a case, the signal received at the input 140 would enable the wordline and then be presented back to the NOR gate 128. In an alternate embodiment, the single wordline output may be used to drive a decode logic block (not shown) to enable a set of wordlines. The number of wordlines presented from the shift register group 66 is shown to be four for illustrative purposes only. A larger number of wordlines or a smaller number of wordlines may be implemented to meet the design criteria of a particular application. Additionally, each wordline may drive a decode logic block that may be used to enable a set of wordlines. For example, the signal at the output 142*a* may be used to drive one or more wordlines, the signal at the output 142*b* may be used to drive one or more additional wordlines, . . . etc.

The self test is generally performed on all the memory elements of the memory array 14. Each of the appropriate local mark signals are asserted and then the programmable element 110 is generally programmed. To program a particular programming element 110, a virtual ground/high voltage element 111 must be connected to a high voltage. Depending on the type of programmable element 104 implemented, an appropriate programming scheme should be implemented. Next, a high voltage is asserted on the global program signal 86. The defective wordline latch 80, indicating if a particular row is defective, enables a discharge path through the transistor M2. This allows the programmable element 104 to be programmed. If there is no discharge path for the programmable element 104, as set by the local mark signal, then the wordlines connected to the transistors M4, M5, M6 and M7 generally do not contain a defective memory element. As a result, the wordline enable circuit 18 remains unchanged (i.e., the programmable element 110 was not programmed). Next, the virtual ground node of the programmable element 104 is changed from a high voltage to a virtual ground and the global program signal is returned to a logic high. Next, a master reset of the wordline enable circuitry 18 is performed.

After the master reset, all of the outputs 88 will remain high if the programmable element 110 was not previously programmed. The outputs 88 will generally be low if the programmable element was programmed. Next, the circuit 10 resumes normal operation. The CMOS pass gates 122 that have the control signal high (i.e., the output 88), will generally activate the particular wordline. The CMOS pass gates 122 that do not have the control signal high (i.e., the output 88), will generally deactivate the particular wordline. As a result, the particular defective wordlines are disabled without having to connect the memory array 14 to an external repairing device such as a laser. This saves significant time in performing tests on the memory array 14.

The global mark signal 36 may be used to provide information to an external device about which particular wordlines are disabled. This information may be used to collect statistical data to determine a particular process deficiency. This statistical data may be used to troubleshoot the fabrication process or for any other statistical reasons.

While the invention has been particularly shown and described with reference to preferred embodiments thereof, it will be understood by those skilled in the art that various changes in form and details may be made without departing from the spirit and scope of the invention.

I claim:

1. A circuit comprising:

a memory array having a plurality of wordlines;

a latch circuit configured to provide a control signal indicating whether one or more of said wordlines is defective; and a reprogrammable element configured to store either (i) a first state enabling a first path from an input to an output bypassing one or more of said wordlines or (ii) a second state enabling a second path from the input through a device to the output in response to said control signal.

2. A circuit comprising:

a memory array having a plurality of wordlines;

a latch circuit configured to provide a control signal indicating whether one or more of said wordlines is defective;

a reprogrammable element configured to store either (i) a first state enabling a first path from an input to an output or (ii) a second state enabling a second path from the input through a device to the output in response to said control signal;

a program circuit configured to generate a program signal;

a global mark circuit configured to generate a global mark signal;

a local mark circuit that converts said global mark signal into a local mark signal indicating which wordlines are defective; and a hold circuit configured to hold said local mark signal for a predetermined time;

wherein said latch circuit generates said control signal in response to said local mark signal and said program signal.

3. The circuit according to claim 2 wherein said one or more wordlines are disabled after a reset occurs.

4. The circuit according to claim 2 wherein said global mark circuit further comprises:

a compare circuit configured to compare a first testing signal received from said memory array with a second testing signal; and a test circuit configured to provide: (i) said first testing signal to said memory array, (ii) said second testing signal to said compare circuit and (iii) said global mark signal when said first and second testing signals are not equal.

5. The circuit according to claim 2 further comprising one or more of said reprogrammable elements, wherein one or more wordlines are disabled in response to said one or more reprogrammable elements.

6. The circuit according to claim 1 wherein said device comprises a shift register that enables a particular wordline of said memory array in response to said reprogrammable element.

7. The circuit according to claim 2 wherein said device comprises a shift register group that enables one or more of said plurality of wordlines of said memory array in response to said reprogrammable element.

8. The circuit according to claim 5 wherein said one or more reprogrammable elements are selected from the group consisting of:

a Floating Avalanche Metal Oxide Semiconductor (FAMOS) transistor, an Electrically Programmable Read Only Memory (EPROM), an Electrically-Erasable Programmable Read Only Memory (EEPROM), and a Field Programmable Gate Array (FPGA).

9. The circuit according to claim 4 wherein said memory array, said latch circuit, said reprogrammable element, said program circuit, said global mark circuit, and said hold circuit are located on a single chip.

10. The circuit according to claim 2 wherein said global mark signal provides statistical information about said memory array.

11. A method for disabling a defective wordline in a memory array having a plurality of wordlines, said method comprising the steps of:

generating a control signal indicating whether one or more of said wordlines is defective;

programming one or more reprogrammable elements in response to said control signal to store (i) a first state for enabling a first path or (ii) a second state for enabling a second path; and disabling one or more defective wordlines in response to said first state of said one or more reprogrammable elements.

12. The method according to claim 11 wherein said generating step comprises:

generating a mark signal; and generating a program signal.

13. The method according to claim 12 further comprising the step of:

resetting said mark signal and said program signal.

14. The method according to claim 12 wherein said step of generating said mark signal comprises:

generating a first test signal;

generating a second test signal; and generating said mark signal when said first and second test signals are not equal.

15. The method according to claim 14 further comprising the step of:

converting said mark signal to a local mark signal to indicate which wordlines are defective to allow the programming of said one or more reprogrammable elements.

16. The method according to claim 15 wherein said step of generating said program signal further comprises:

detecting an end of generating said first and second test signals; and asserting a program signal to program said reprogrammable element.

17. The method according to claim 11 wherein said reprogrammable elements are selected from the group consisting of:

a Floating Avalanche Metal Oxide Semiconductor (FAMOS) transistor, an Electrically Programmable Read Only Memory (EPROM), an Electrically-Erasable Programmable Read Only Memory (EEPROM), and a Field Programmable Gate Array (FPGA).

18. A circuit comprising:

a memory array having a plurality of wordlines;

a latch circuit configured to provide a control signal indicating whether one or more of said wordlines is defective;

a reprogrammable element configured to store one of (i) a first state enabling a first path from an input to an output or (ii) a second state enabling a second path from the input through a shift register that enables a particular wordline of said memory array in response to said reprogrammable element.

19. A circuit comprising:

a memory array having a plurality of wordlines;

a latch circuit configured to provide a control signal indicating whether one or more of said wordlines is defective;

a reprogrammable element configured to store either (i) a first state enabling a first path from an input to an output or (ii) a second state enabling a second path from the input through a device to the output in response to said control signal;

a program circuit configured to generate a program signal;

a global mark circuit configured to generate a global mark signal;

a local mark circuit that converts said global mark signal into a local mark signal indicating which wordlines are defective; and a hold circuit configured to hold said local mark signal for a predetermined time wherein said latch circuit generates said control signal in response to said local mark signal and said program signal.

20. The circuit according to claim 1 wherein said circuit further comprises:

a global mark circuit configured to generate a global mark signal;

a compare circuit configured to compare a first testing signal received from said memory array with a second testing signal; and a test circuit configured to provide: (i) said first testing signal to said memory array, (ii) said second testing signal to said compare circuit and (iii) said global mark signal when said first and second testing signals are not equal.

* * * * *